(12) United States Patent
Schweitzer, III et al.

(10) Patent No.: US 10,483,747 B2
(45) Date of Patent: Nov. 19, 2019

(54) DETECTION OF AN ELECTRIC POWER SYSTEM FAULT DIRECTION USING TRAVELING WAVES

(71) Applicant: Schweitzer Engineering Laboratories, Inc., Pullman, WA (US)

(72) Inventors: Edmund O. Schweitzer, III, Pullman, WA (US); Armando Guzman-Casillas, Pullman, WA (US); Bogdan Z. Kasztenny, Markham (CA); Mangapathirao Venkata Mynam, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 573 days.

(21) Appl. No.: 15/291,295

(22) Filed: Oct. 12, 2016

(65) Prior Publication Data
US 2017/0104324 A1     Apr. 13, 2017

Related U.S. Application Data

(60) Provisional application No. 62/240,203, filed on Oct. 12, 2015.

(51) Int. Cl.
*H02H 1/00*     (2006.01)
*G01R 31/08*    (2006.01)
(Continued)

(52) U.S. Cl.
CPC ......... *H02H 1/0007* (2013.01); *G01R 31/085* (2013.01); *G01R 31/11* (2013.01); *H02H 3/38* (2013.01)

(58) Field of Classification Search
CPC .. G01R 31/085; G01R 19/2513; G01R 27/16; G01R 31/08; G01R 31/086;
(Continued)

(56) References Cited

U.S. PATENT DOCUMENTS 3,585,298 A    6/1971    Liberman
3,670,240 A    6/1972    Maranchak
(Continued)

FOREIGN PATENT DOCUMENTS

EP    226210    12/1986
EP    241832     7/1990
(Continued)

OTHER PUBLICATIONS

Harshad Mehta, Fault Location Techniques for High-Voltage DC Lines, EPRI EL-4331 Project 2150-1, 1985.
(Continued)

*Primary Examiner* — Thienvu V Tran
*Assistant Examiner* — Nicolas Bellido
(74) *Attorney, Agent, or Firm* — Jared L. Cherry; Richard M. Edge

(57) ABSTRACT

The present disclosure relates to a fault in an electric power delivery system. In one embodiment, a system may include a data acquisition subsystem configured to receive a plurality of representations of electrical conditions associated with at least a portion of the electric power delivery system. A traveling wave detector may be configured to detect a traveling wave event based on the plurality of representations of electrical conditions. A traveling wave directional subsystem may be configured to calculate an energy value of the traveling wave event during an accumulation period based on the detection of the traveling wave by the traveling wave disturbance detector. A maximum and a minimum energy value may be determined during the accumulation period. A fault direction may be determined based on the maximum energy value and the minimum energy value. A fault detector subsystem configured to declare a fault based on the determined fault direction.

21 Claims, 14 Drawing Sheets

(51) Int. Cl.
*G01R 31/11* (2006.01)
*H02H 3/38* (2006.01)

(58) Field of Classification Search
CPC .. G01R 31/088; G01R 31/11; G01R 31/2836; G01R 31/40; G05B 9/02; H02H 1/0007; H02H 1/0092; H02H 3/042; H02H 3/083; H02H 3/38; H02H 7/20; H02H 7/263; H02H 7/265; H04B 3/46
See application file for complete search history.

(56) References Cited

U.S. PATENT DOCUMENTS

| | | | |
|---|---|---|---|
| 3,878,460 | A | 4/1975 | Nimmersjö |
| 3,890,544 | A | 6/1975 | Chamia |
| 3,956,671 | A | 5/1976 | Nimmersjö |
| 4,053,816 | A | 10/1977 | Nimmersjö |
| 4,063,160 | A | 12/1977 | Lanz |
| 4,063,166 | A * | 12/1977 | Glavitsch .............. G01R 31/085 324/522 |
| 4,254,444 | A | 3/1981 | Eriksson |
| 4,296,452 | A | 10/1981 | Eriksson |
| 4,344,142 | A | 8/1982 | Diehr |
| 4,351,011 | A | 9/1982 | Liberman |
| 4,377,834 | A | 3/1983 | Eriksson |
| 4,499,417 | A | 2/1985 | Wright |
| 4,626,772 | A | 12/1986 | Michel |
| 4,719,580 | A * | 1/1988 | Nimmersjo ............ H02H 7/265 324/512 |
| 4,766,549 | A | 8/1988 | Schweitzer |
| 4,797,805 | A | 1/1989 | Nimmersjö |
| 4,800,509 | A | 1/1989 | Nimmersjö |
| 5,446,387 | A | 8/1995 | Eriksson |
| 5,572,138 | A | 11/1996 | Nimmersjö |
| 5,682,100 | A | 10/1997 | Rossi |
| 5,729,144 | A | 3/1998 | Cummins |
| 6,341,055 | B1 * | 1/2002 | Guzman-Casillas ....................... H02H 3/283 361/115 |
| 6,417,791 | B1 | 7/2002 | Benmouyal |
| 6,477,475 | B1 | 11/2002 | Takaoka |
| 6,597,180 | B1 | 7/2003 | Takaoka |
| 6,798,211 | B1 | 9/2004 | Rockwell |
| 7,174,261 | B2 | 2/2007 | Gunn |
| 7,397,427 | B1 | 7/2008 | Rhoads |
| 7,535,233 | B2 | 5/2009 | Kojovic |
| 7,714,735 | B2 * | 5/2010 | Rockwell ............ G01R 19/2513 324/126 |
| 7,733,094 | B2 | 6/2010 | Bright |
| 8,315,827 | B2 * | 11/2012 | Faybisovich ........ G01R 31/085 702/59 |
| 8,525,522 | B2 | 9/2013 | Gong |
| 8,598,887 | B2 * | 12/2013 | Bjorklund ............ G01R 31/088 324/535 |
| 8,655,609 | B2 | 2/2014 | Schweitzer |
| 8,781,766 | B2 | 7/2014 | Schweitzer |
| 8,990,036 | B1 | 3/2015 | Schweitzer |
| 9,470,748 | B2 * | 10/2016 | Schweitzer, III .. G01R 31/2836 |
| 2001/0012984 | A1 | 8/2001 | Adamiak |
| 2002/0165462 | A1 | 11/2002 | Westbrook |
| 2004/0189317 | A1 | 9/2004 | Borchert |
| 2004/0230387 | A1 | 11/2004 | Bechhoefer |
| 2006/0012374 | A1 | 1/2006 | Kojovic |
| 2008/0077336 | A1 | 3/2008 | Fernandes |
| 2009/0230974 | A1 | 9/2009 | Kojovic |
| 2011/0173496 | A1 | 7/2011 | Hosek |
| 2011/0264388 | A1 | 10/2011 | Gong |
| 2012/0086459 | A1 | 4/2012 | Kim |
| 2013/0021039 | A1 | 1/2013 | Bjorklund |
| 2013/0096854 | A1 | 4/2013 | Schweitzer |
| 2013/0100564 | A1 | 4/2013 | Zhang |
| 2014/0074414 | A1 | 3/2014 | Schweitzer, III |
| 2015/0081235 | A1 | 3/2015 | Schweitzer |
| 2016/0077150 | A1 | 3/2016 | Schweitzer |

FOREIGN PATENT DOCUMENTS

| | | |
|---|---|---|
| EP | 164711 | 12/1991 |
| EP | 244649 | 4/1992 |
| EP | 627085 | 12/2005 |
| GB | 1463755 | 2/1977 |
| WO | 9519060 | 7/1995 |
| WO | 2010099585 | 9/2010 |

OTHER PUBLICATIONS

Masaoki Ando, Edmund O. Schweitzer III, R. A. Baker, Development and Field-Data Evaluation of Single-End Fault Locator for Two-Terminal HVDC Transmission Lines, IEEE Transactions on Power Apparatus and Systems, vol. PAS-104, No. 12, 1985.

Masaoki Ando, Fault Location Techniques for HVDC Lines: Analysis, Development, Simulation, and Field-Data Evaluation, 1984.

P.F. Gale, Overhead Line Fault Location Based On Travelling Waves & GPS, 1993.

Harry Lee, Development of an Accurate Transmission Line Fault Locator Using the Glabal Positioning System and Satellites, 1994.

Hewlett Packard, Traveling Wave Fault Location in Power Transmission Systems, Application Note 1285, 1997.

Michael A. Street, Delivery and Application of Precise Timing for a Traveling Wave Powerline Fault Locator System, 1990.

Sergio Luiz Zimath, Marco Antonio Ramos, Jayme Silva Filho, Joaquim Moutinho Beck, Nei Mueller, Traveling Wave-Based Fault Location Experiences, 2010.

Qualitrol Corporation, Telefault TWS Traveling Wave Fault Locator, Qualitrol Brochure 2004.

PCT/US2012/060089 Patent Cooperation Treaty, International Search Report and Written Opinion of the International Searching Authority, dated Feb. 5, 2013.

Elhaffar, Power Transmission Line Fault Location Based on Current Traveling Waves. TKK Dissertations 107, Espoo 2008, Helsinki University of Technology. Department of Electrical Engineering, Dec. 2008.

Reason International, Inc., Traveling Wave Fault Location in Power Transmission Systems, White Paper.

Carlos Alberto Dutra, Rafael Rosar Matos, Sergio Luiz Zimath, Jurandir Paz De Oliveira, Joao Henrique Monteiro De Resende, Joaquim Americo Pinto Moutinho, Fault Location by Traveling Waves: Application in High Impedance Events.

N. Fischer, V. Skendzic, R. Moxley, J. Needs, Protective Relay Traveling Wave Fault Location, Feb. 9, 2012.

PCT/US2014/055894 Patent Cooperation Treaty, International Search Report and Written Opinion of the International Searching Authority, dated Dec. 17, 2014.

PCT/US2014/055896 Patent Cooperation Treaty, International Search Report and Written Opinion of the International Searching Authority, dated Dec. 18, 2014.

PCT/US2014/055919 Patent Cooperation Treaty, International Search Report and Written Opinion of the International Searching Authority, dated Dec. 22, 2014.

Borghetti, et al, "On the use of continuous-wavelet transform for fault location in distribution power systems." International Journal of Electrical Power & Energy Systems. Nov. 2006.

Maher M.I. Hashim, Hew Wooi Ping, V.K. Ramachandaramurthy, Impedance-Based Fault Location Techniques for Transmission Lines, Sep. 2009.

Zheng et al., Study on Impedance-Traveling Wave Assembled Algorithm in One-Terminal Fault Location System for Transmission Lines, Apr. 2008.

Gabriel Benmouyal, Karl Zimmerman, Experience With Subcycle Operating Time Distance Elements in Transmission Line Digital Relays, Presented at the 37th Annual Western Protective Relay Conference Oct. 2010.

Edmund O. Schweitzer, III, Armando Guzman-Casillas, Mangapathirao Venkat Mynam, Veselin Skendzic, Bogdan Kasztenny, Stephen Marx, Locating Faults by the Traveling Waves They Launch, Feb. 10, 2014.

(56) References Cited

OTHER PUBLICATIONS

Toshio Tahagi, Jun-Ichi Baba, Katauhiko Usmura, Tishiaki Sakaguchi, Fault Protection Based on Travelling Wave Theory—Part I Theory, Jan. 24, 1977.

PCT/US2015/050504 Patent Cooperation Treaty, International Search Report and Written Opinion of the International Searching Authority, dated Jan. 29, 2016.

He, Baina, Yunwei Zhao, and Hengxu Ha. "A Novel Wave Based Differential Protection for Distributed Parameter Line." TELKOMNIKA Indonesian Journal of Electrical Engineering TELKOMNIKA 11.9 (2013): 5097-104.

Tang, Lanxi; Dong, Xinzhou; Shi, Shenxing; Wang, Bin; "Travelling Wave Differential Protection Based on Equivalent Travelling Wave", 13th IET International Conference on Developments in Power System Protection (DPSP 2016), Mar. 7-10, 2016.

PCT/US2016/056466 Patent Cooperation Treaty, International Search Report and Written Opinion of the International Searching Authority, dated Jan. 9, 2017.

\* cited by examiner

DETECTION OF AN ELECTRIC POWER SYSTEM FAULT DIRECTION USING TRAVELING WAVES

RELATED APPLICATION

The present application claims priority under 35 U.S.C. § 119(e) to U.S. Provisional Patent Application No. 62/240,203, filed Oct. 12, 2015, titled "TRAVELING WAVE DIRECTIONAL ELEMENT," which is hereby incorporated by reference in its entirety.

TECHNICAL FIELD

This disclosure relates to detecting fault direction in an electric power delivery system. More particularly, this disclosure relates to using traveling wave principles to determine whether a fault on an electric power delivery system is internal or external to a zone of protection.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
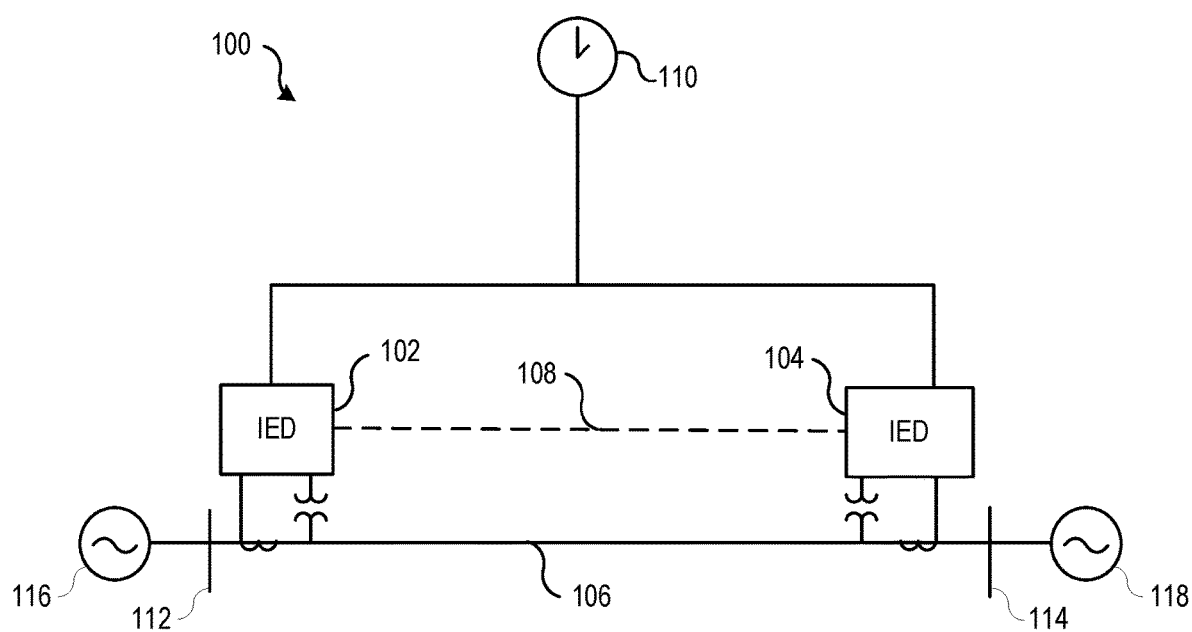
FIG. 1 illustrates a block diagram of a system for detecting a traveling wave and calculating a location of a fault using the detected traveling wave consistent with certain embodiments of the present disclosure.

Faster transmission line protection improves power system stability. If faults are not cleared before the critical fault clearing time, the system may lose transient stability and possibly suffer a black out. In addition, faster fault clearing increases the amount of power that can be transferred. Faster protection also enhances public and utility personnel safety, limits equipment wear, improves power quality, and reduces property damage.

Most protection principles are based on the fundamental frequency components of voltages and currents. Accurate measurement of a sinusoidal quantity typically takes a cycle. To increase the speed of protection actions, an analysis of transient components may be undertaken in connection with various embodiments of the present disclosure. Further, information relating to electrical conditions may be communicated among devices to provide end-to-end transmission line protection.

Primary protective relaying systems typically operate in one to one-and-a-half cycles, and the breakers interrupt current in one-and-a-half to three cycles, so faults are typically cleared in three to four cycles. Sometimes the relaying system operates faster. For example, sensitive instantaneous overcurrent elements can be used for switch-onto-fault events, and may have an operation time as low as one-quarter of a cycle. Traditional frequency domain techniques obtained by extracting fundamental frequency components (phasors) may be applied to identify a fault after transient signals fade. The filtering necessary for phasor measurement results in operating times of about one power cycle, with the best-case times approaching half a cycle for close-in high-current faults.

However, for purposes of determining stability limits for planning purposes, it is most appropriate to utilize conservative protection operating times. If a breaker fails to trip, breaker failure schemes take over, and fault clearing is delayed until the slowest backup breaker operates, which may be around 10 to 12 cycles. If time-coordinated remote backup protection is used instead of breaker failure protection, the fault clearing time may be as high as a few hundred milliseconds.

High-speed protection devices respond to high-frequency signal components, which may be used to detect faults and to realize various advantages. For example, certain nontraditional energies, such as wind and solar, are connected to the power system through a power electronics interface. As such, these sources typically have little or no inertia. Their control algorithms protect the converters for network fault conditions. As a result, these sources produce voltages and currents that challenge some protection principles developed for networks with synchronous generators. In contrast, high-speed protection devices configured to respond to high-frequency signal components are less dependent on the sources and more dependent on the network itself. As a result, such relays may be useful in applications near non-traditional sources.

Various embodiments consistent with the present disclosure may analyze traveling waves (TWs) to aid in the detection of faults. When a fault occurs in an electric power system, traveling waves are launched from the fault and travel outward at a velocity near the speed of light. The traveling waves are reflected by buses and other discontinuities according to their corresponding characteristic impedances. In the initial stage of the fault, the electric power system may behave like a distributed parameter network. Accordingly, the traveling waves may be described by the propagation velocity, the reflection and transmission coefficients, and the line characteristic impedance. Using a traveling wave detection algorithm, a high-speed relay may be able to detect a fault and initiate corrective action in less than 1 millisecond consistent with certain embodiments of the present disclosure.

After a few roundtrip reflections, traveling waves from a fault recombine into stationary waves, and the power system may be approximated using a lumped parameter RLC network in a transient state. Given the speed of traveling waves, such a condition may be realized very shortly following the occurrence of a fault. TWs from a fault anywhere on a 100-mile line reach both ends within 600 microseconds. Various embodiments consistent with the present disclosure may analyze the "lumped circuit theory" transient waveforms to detect a fault and initiate corrective action within milliseconds consistent with certain embodiments of the present disclosure.

Various techniques may be used to simplify models utilized in certain embodiments. For example, certain embodiments may analyze incremental quantities, which are signals that appear due to a fault and do not contain load currents. Incremental quantities may simplify the line and system representation by eliminating power sources and leaving the fault as the only "source" in the equivalent network. In other words, the driving force of the transient is the fault, and the driving force of the steady-state response is the set of system fundamental frequency sources (e.g., generators).

Ultra-high-speed principles allow relays to identify events that are located within the protected zone but are not necessarily permanent faults. Incipient cable failures or surge arrester conduction events may present detection challenges to existing feeder and bus relays, respectively. Similarly, the ultra-high-speed line protection needs to ensure that an in-zone event is a legitimate fault.

In some embodiments, a traveling wave directional element consistent with the present disclosure may be operated in addition to phasor-based protection elements. In such arrangements, the traveling wave-direction element may be biased for speed of operation rather than dependability. Accordingly, the traveling wave directional element may, in a portion of faults, identify and operate quickly. The dependable but slower operating phasor-based protection elements may identify and clear any faults unresolved by the traveling wave directional element. The combined result of such a system may reduce the average operating time of the system.

The embodiments of the disclosure will be best understood by reference to the drawings, wherein like parts are designated by like numerals throughout. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

In some cases, well-known features, structures or operations are not shown or described in detail. Furthermore, the described features, structures, or operations may be combined in any suitable manner in one or more embodiments. It will also be readily understood that the components of the embodiments as generally described and illustrated in the figures herein could be arranged and designed in a wide variety of different configurations.

Several aspects of the embodiments described may be illustrated as software modules or components. In other embodiments, hardware-implemented embodiments may be used. Such embodiments may utilize, among other technologies, field-programmable gate arrays. As used herein, a software module or component may include any type of computer instruction or computer executable code located within a memory device and/or transmitted as electronic signals over a system bus or wired or wireless network. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. Indeed, a module or component may comprise a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a machine-readable medium having stored thereon instructions that may be used to program a computer (or other electronic device) to perform processes described herein. The machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable medium suitable for storing electronic instructions.

FIG. 1 illustrates a block diagram of a system 100 for detecting and calculating a location of a fault using time-domain principles and elements further described herein. System 100 may include generation, transmission, distribution and/or similar systems. System 100 includes a conductor 106 such as a transmission line connecting two nodes, which are illustrated as a local terminal 112 and a remote terminal 114. Local and remote terminals 112 and 114 may be buses in a transmission system supplied by generators 116 and 118, respectively. Although illustrated in single-line form for purposes of simplicity, system 100 may be a multi-phase system, such as a three-phase electric power delivery system.

System 100 is monitored by IEDs 102 and 104 at two locations of the system, although additional IEDs may also be utilized to monitor other locations of the system. As used herein, an IED (such as IEDs 102 and 104) may refer to any microprocessor-based device that monitors, controls, automates, and/or protects monitored equipment within system 100. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. IEDs 102 and 104 may obtain electric power system information using current transformers (CTs), potential transformers (PTs), Rogowski coils, voltage dividers and/or the like. IEDs 102, 104 may be capable of using inputs from conventional instrument transformers such as CTs and PTs conventionally used in monitoring of electric power delivery. IEDs 102 and 104 may also receive common time information from a common time source 110. In certain embodiments, time information may not be necessary for the elements to operate correctly. For example the traveling wave directional element may not require time information for correct operation.

Common time source 110 may be any time source capable of delivering a common time signal to each of IEDs 102 and 104. In various embodiments, common time source 110 may be a Global Navigation Satellite System ("GNSS"). Examples of GNSS systems include the Global Positioning System ("GPS"), the GLObal NAvigation Satellite System (GLONASS), and the Galileo Satellite System. GNSS systems may be used by multiple devices and applications distributed across large areas, and may avoid the need for costly high-accuracy time sources in multiple locations. In addition to GNSS, common time source 110 may be embodied using an IRIG system, a WWVB or WWV system, a network-based system such as corresponding with IEEE 1588 precision time protocol, and/or the like. According to one embodiment, common time source 110 may comprise a satellite-synchronized clock (e.g., Model No. SEL-2407, available from Schweitzer Engineering Laboratories of Pullman Wash.). Further, it should be noted that each IED 102, 104 may be in communication with a separate clock, such as a satellite-synchronized clock, with each clock providing each IED 102, 104 with a common time signal. The common time signal may be derived from a GNSS system or other time signal.

A data communication channel 108 may allow IEDs 102 and 104 to exchange information relating to, among other things, traveling wave direction, traveling wave polarity, time-domain incremental quantity based fault direction, and other measurements reflecting electrical conditions on conductor 106. According to some embodiments, a time signal based on common time source 110 may be distributed to and/or between IEDs 102 and 104 using data communication channel 108. Data communication channel 108 may be embodied in a variety of media and may utilize a variety of communication protocols. For example, data communication channel 108 may be embodied utilizing physical media, such as coaxial cable, twisted pair, fiber optic, etc. Further, data communication channel 108 may utilize communication protocols such as Ethernet, SONET, SDH, or the like, in order to communicate data.

Figure 2A:
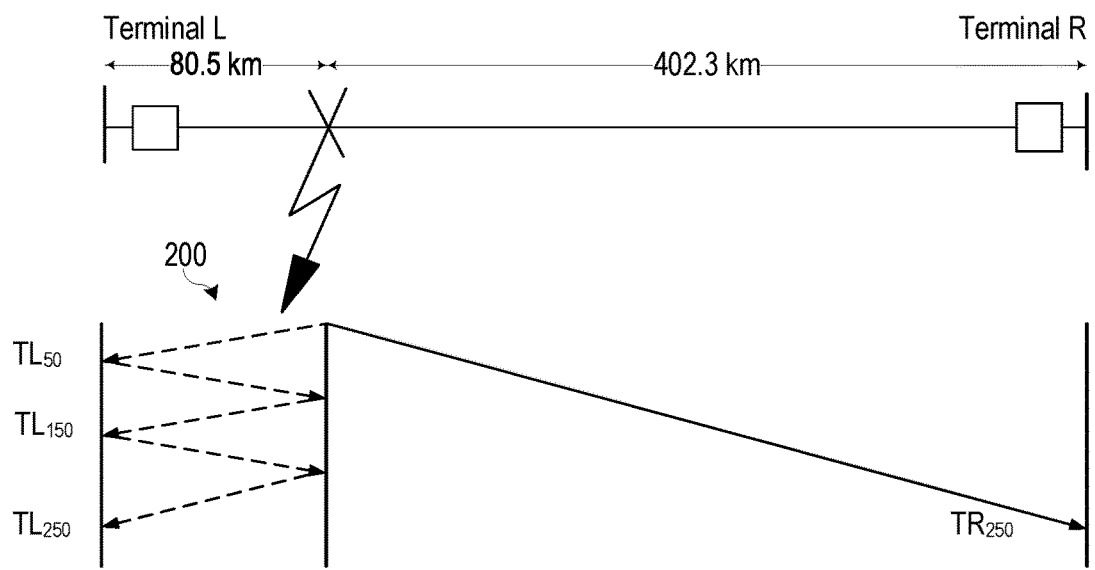
FIG. 2A illustrates a lattice diagram showing incident and reflected traveling waves over a relative time scale created by a fault event on a 300 mile (482.8 km) long transmission line consistent with certain embodiments of the present disclosure.

FIG. 2A illustrates a lattice diagram 200 showing incident and reflected traveling waves created by a fault consistent with certain embodiments of the present disclosure. In the illustrated embodiment, a fault is located 50 miles (80.5 km) from a first terminal on a 300 mile (482.8 km) long line. The incident wave launched by the fault reaches the Terminal L at time $TL_{50}$, and reaches the Terminal R at time $TR_{250}$.

Figure 2B:
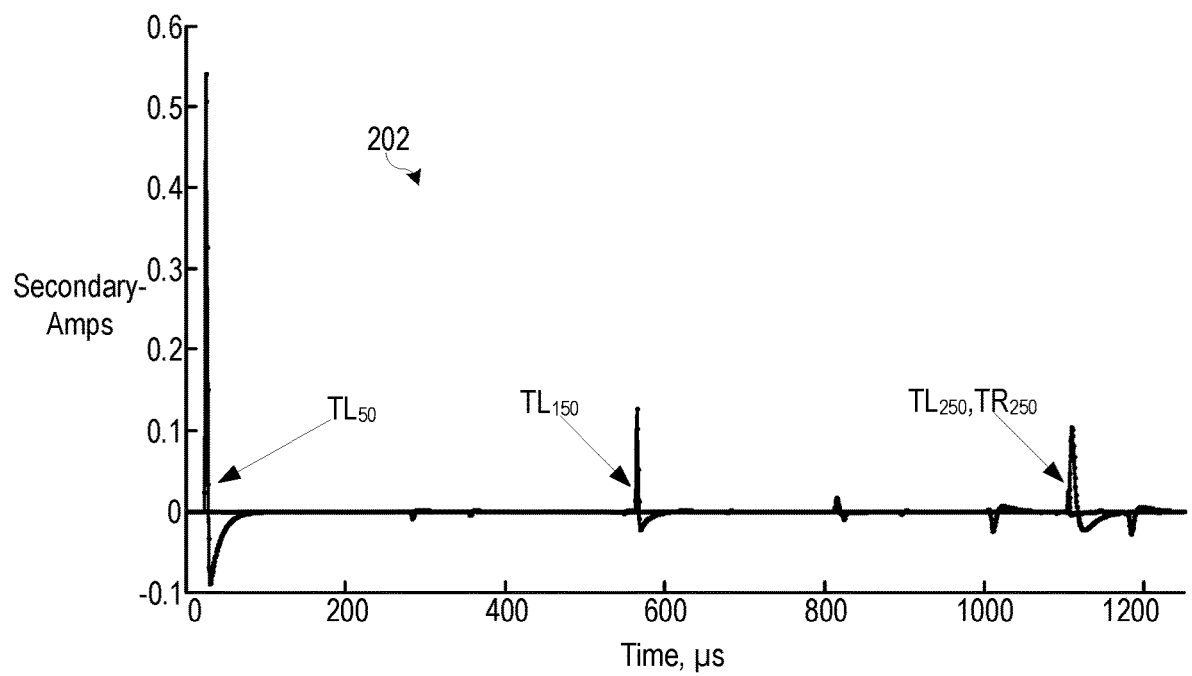
FIG. 2B illustrates the incident and reflected traveling waves as a function of current over time from the fault illustrated in FIG. 2A consistent with certain embodiments of the present disclosure.

FIG. 2B illustrates a diagram 202 showing the reflections from the fault at Terminal L. The polarity, amplitude, and arrival time of the reflected waves can be used to identify the reflected wave from the fault or the remote terminal and calculate the fault location.

Figure 2C:
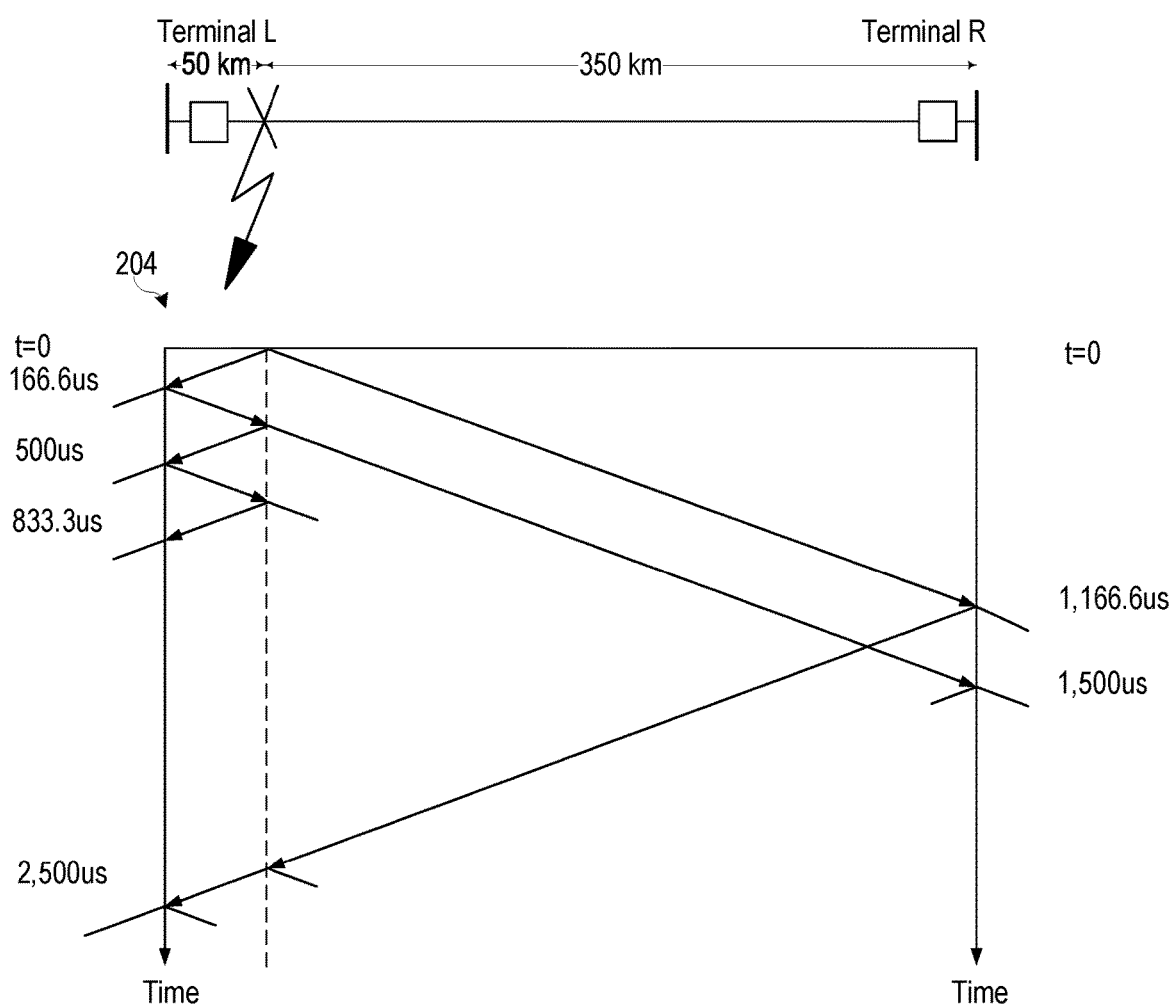
FIG. 2C illustrates a lattice diagram showing the incident and reflected traveling waves at a remote terminal and a local terminal from a fault event on a 400 km long transmission line consistent with certain embodiments of the present disclosure.

FIG. 2C illustrates a lattice diagram 204 showing the incident and reflected traveling waves at a remote terminal and a local terminal from a fault event on a 400 km long transmission line consistent with certain embodiments of the present disclosure. Assuming a $3 \times 10^8$ m/s propagation velocity, a fault located at 50 km on a 400 km line would result in a time lag between the initial front-wave and the first legitimate reflection from the fault that may be calculated using Equation 1.

$$\frac{2 X 50 X 10^3}{3 X 10^8} = 333 \ \mu s \qquad \text{Eq. 1}$$

As illustrated in FIG. 2C, a local relay generates measurement with respect to the first arriving wave, which is 166.6 μs, because of the 50 km distance between the local relay and the fault.

Figure 2D:
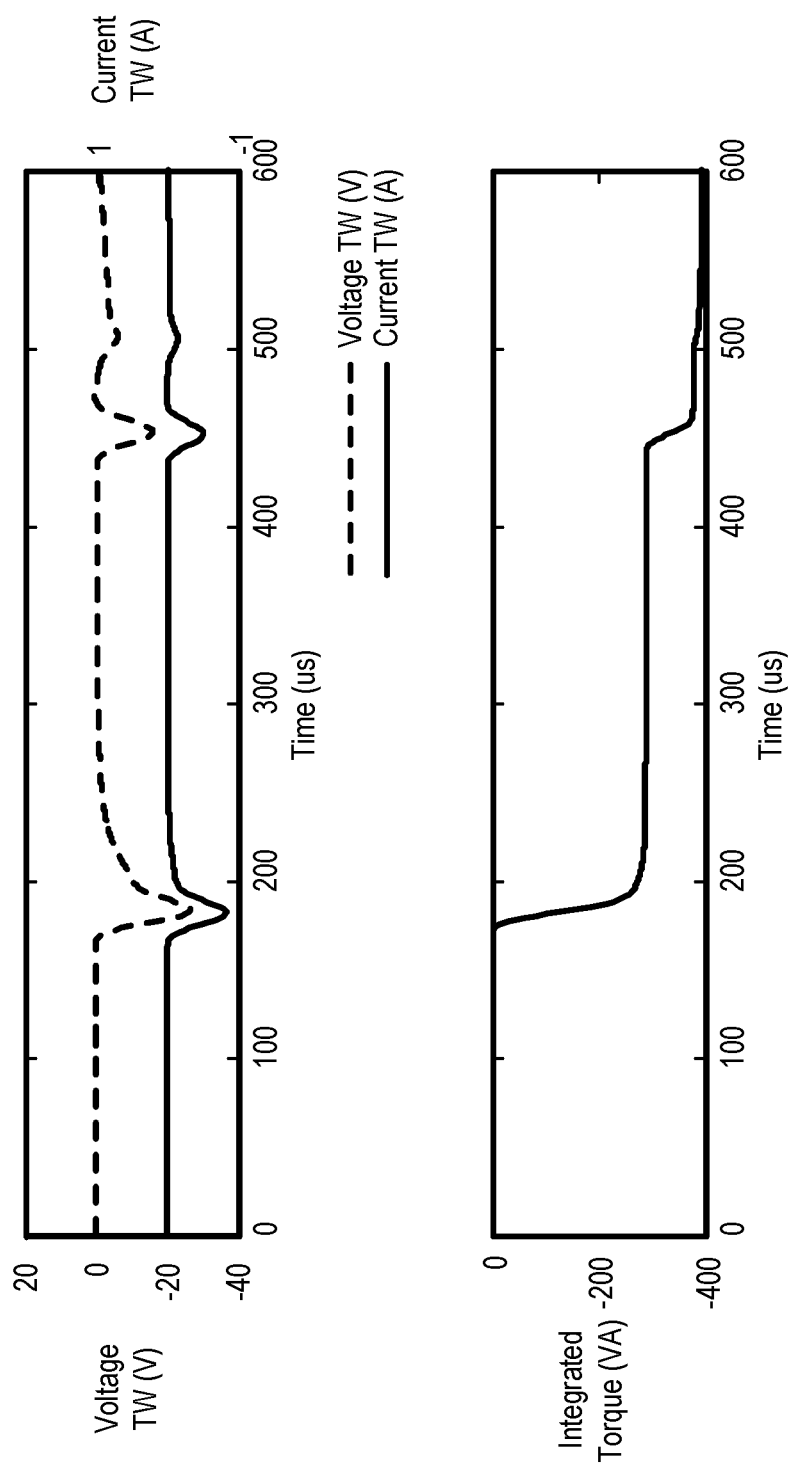
FIG. 2D illustrates plots showing traveling wave current and voltage signals and an integrated torque value for a reverse fault consistent with certain embodiments of the present disclosure.

FIG. 2D illustrates plots showing traveling wave current and voltage signals and an integrated torque value for a reverse fault consistent with certain embodiments of the present disclosure. A traveling wave with a negative voltage polarity and a negative current polarity occurs at approximately 170 μs. In various embodiments, the polarity of the traveling wave may be used to determine the fault direction. Voltage and current polarities are opposite if the fault is in the forward direction. If the fault is in the reverse direction, the voltage and current traveling waves have the same polarity.

Systems and methods consistent with the present disclosure may determine that the traveling wave occurred in the reverse direction (i.e., outside of a zone of protection) because the voltage and current traveling waves have the same polarity. In various embodiments, the voltage and current signals illustrated in FIG. 2D may be the secondary signals of the instrument transformers.

The plot of the torque value reflects the integrated value of a negated product of the voltage traveling wave signal and the current traveling wave signal. In some embodiments, the negated, or sign-inverted, value may be used so that the torque quantity is positive for forward events and negative for reverse events. For a reverse fault, as illustrated in FIG. 2D, the product is negative and the element integrates down.

Figure 2E:
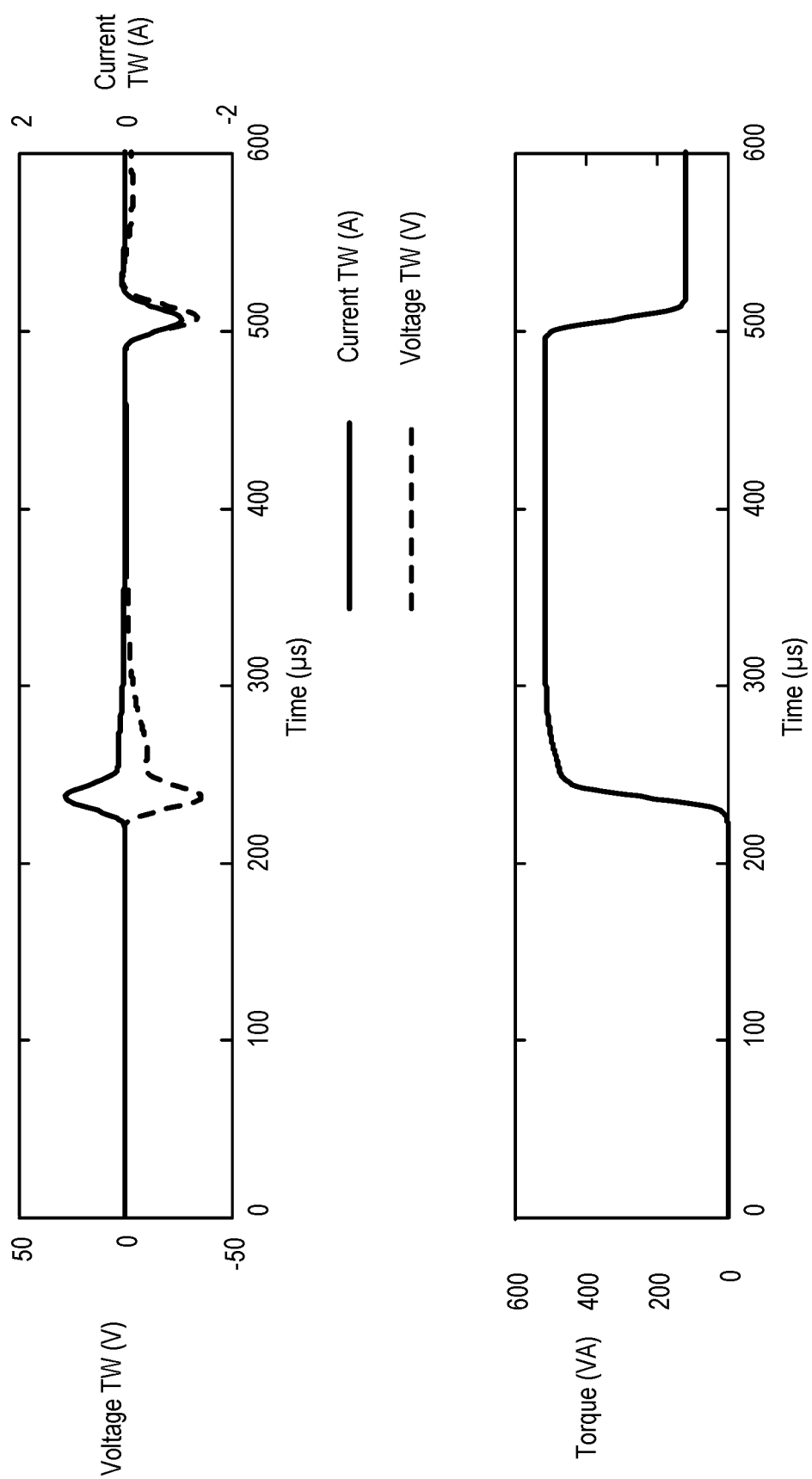
FIG. 2E illustrates plots showing traveling wave current and voltage signals and an integrated torque value for a forward fault consistent with certain embodiments of the present disclosure.

FIG. 2E illustrates plots showing traveling wave current and voltage signals and an integrated torque value for a forward fault consistent with certain embodiments of the present disclosure. Voltage and current polarities are opposite if the fault is in the forward direction. Systems and methods consistent with the present disclosure may determine that the traveling wave occurred in the forward direction (i.e., inside a zone of protection) because the voltage and current traveling waves have opposite polarities.

The plot of the torque value reflects the integrated value of a negated product of the voltage traveling wave signal and the current traveling wave signal. In some embodiments, the negated, or sign-inverted, value may be used so that the torque quantity is positive for forward events and negative for reverse events. For a forward fault, as illustrated in FIG. 2E, the product is positive and the element integrates up.

The time-domain electric power system fault detection and location techniques described herein do not require a complete electric power system cycle to calculate measurements of voltage or current. Conventional PTs and CTs may be used to provide signals corresponding to the voltage and current of the electric power delivery system, which may be used for fault detection and location calculations in less than one electric power system cycle.

One of the challenges of the traveling wave directional element (TW32) for determining the fault direction using TWs is that security can be compromised when protecting parallel lines where the lines are on the same tower. In these applications, the TW32 element of the un-faulted line has the tendency to operate when there is a fault in the corresponding parallel line. The directional element described herein may use an incremental quantity directional element (TD32) in combination with a TW32 element to add security. Another challenge for the TW32 element is the selection of the faulted phase in single-pole tripping applications. The directional element described herein also uses the per-phase incremental elements (TD32AF for the A-phase; TD32BF for the B-phase; and TD32CF for the C-phase) to select the proper phase to trip.

Figure 3A:
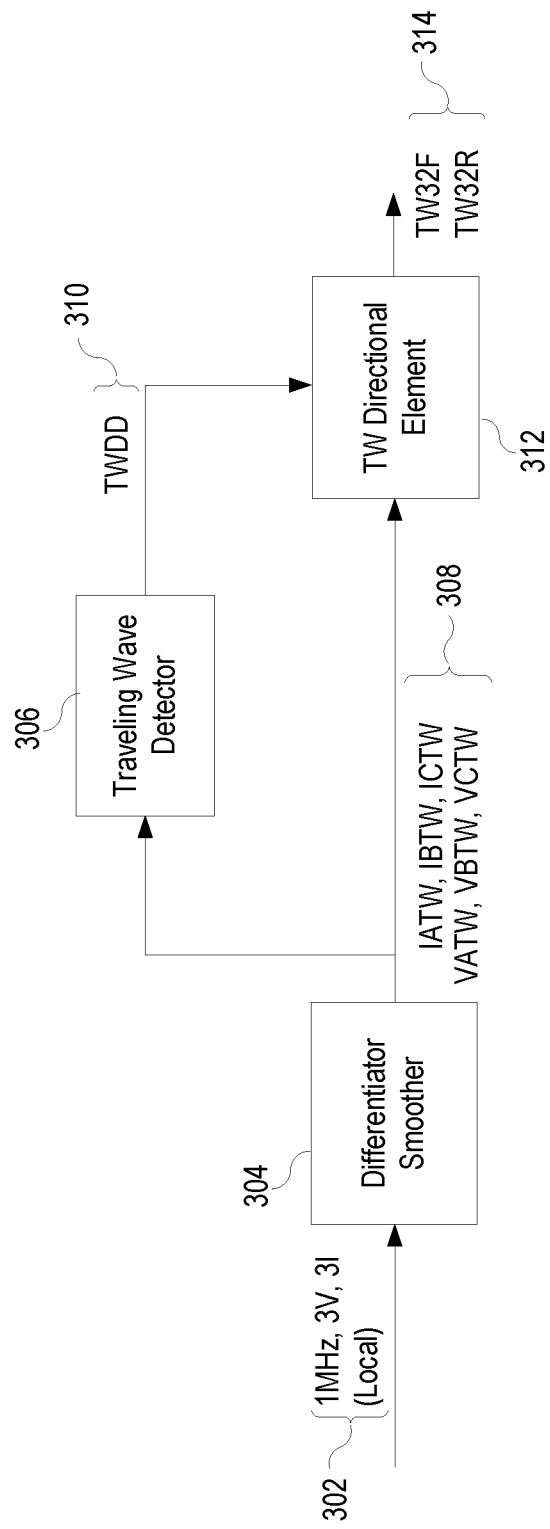
FIG. 3A illustrates a simplified functional block diagram for extracting traveling wave information signals from electric power system signals consistent with certain embodiments of the present disclosure.

FIG. 3A illustrates a simplified functional block diagram for extracting traveling wave information signals from electric power system signals 302 consistent with certain embodiments of the present disclosure. In the illustrated embodiment, the electric power system signals include sampled representations of voltage and current measurements. The electric power system signals 302 may include three voltage signals (one for each of the A-phase, B-phase, and C-phase) and three current signals (one for each of the A-phase, B-phase, and C-phase). In the illustrated embodiment, the electric power system signals 302 are sampled at 1 Mhz. In other embodiments, the sampling rate may be greater than or less than 1 Mhz.

A differentiator-smoother 304 may be configured to determine traveling wave phase currents (IATW for A-phase; IBTW for B-phase; ICTW for C-phase) and voltages (VATW for A-phase; VBTW for B-phase; and VCTW for C-phase). Over such a short period of a time (e.g., on the order of tens of microseconds), the current in an electric power system is quasi-constant (i.e., changing slowly). In contrast, a traveling wave represents a sharp change from one quasi-steady level to a different quasi-steady level. Differentiator-smoother 304 may respond to the rate of change of the incoming signal and may smooth the output. The output of the differentiator-smoother 304 may be inputs to a traveling wave detector 306 and a traveling wave directional element 312.

The traveling wave phase currents and voltages 308 may be used by a traveling wave detector 306 to detect a traveling wave. In various embodiments, the traveling wave detector 306 may compare the traveling wave phase currents and voltages 308 to thresholds to detect a traveling wave. The detection of a traveling wave may be indicated by assertion of a signal, TW50DD 310.

The traveling wave phase currents and phase voltages 308 and traveling wave detection signal, TW50DD 310, may be used by a traveling wave directional element 312 to determine whether a detected traveling wave was launched by a forward or reverse fault, which may be identified by the output signals TW32F, TW32R 314.

Figure 3B:
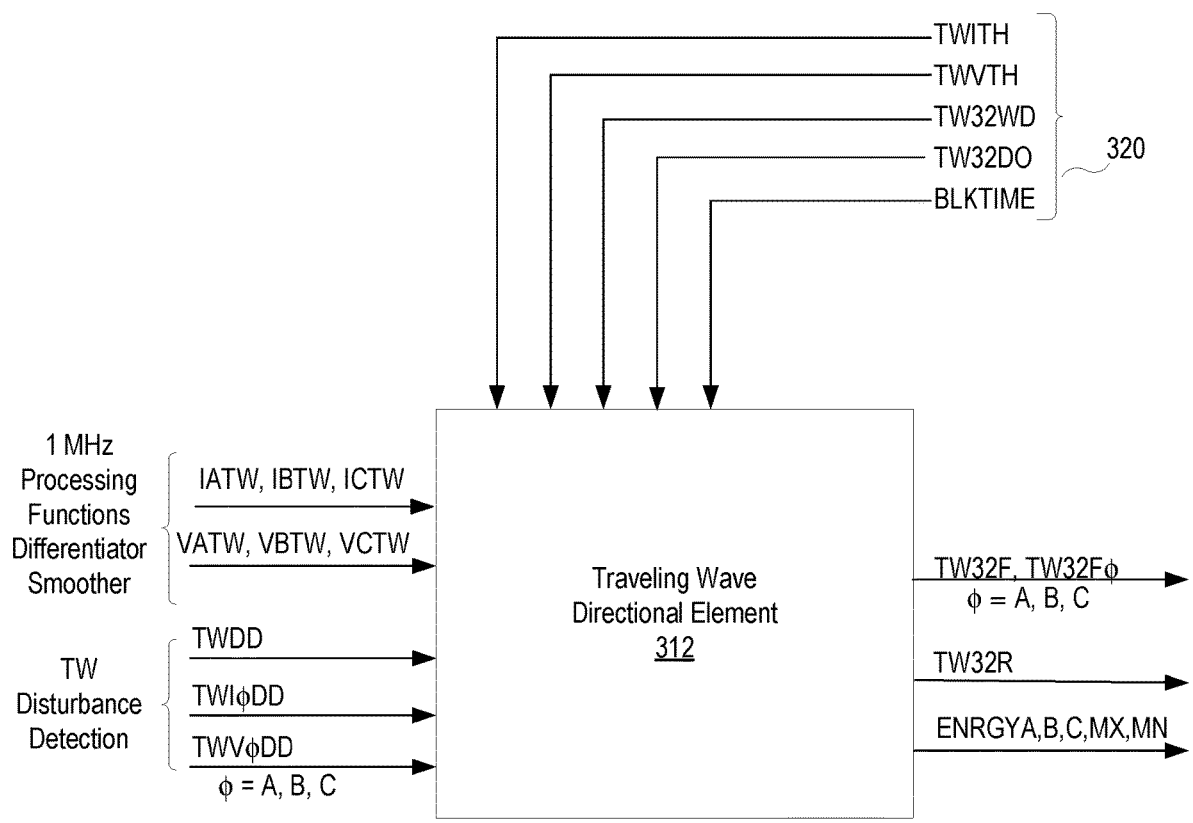
FIG. 3B illustrates inputs and outputs of a traveling wave directional element consistent with certain embodiments of the present disclosure.

FIG. 3B illustrates inputs and outputs of a traveling wave directional element 312 consistent with certain embodiments of the present disclosure. Table 1.1.1, below, lists the input signals to the traveling wave directional element 312. Table 1.1.2, below, lists a plurality of setting parameters 320 that may be used by the traveling wave directional element 312. Table 1.1.3 lists the output signals 314 of the traveling wave directional element 312. The specific settings, inputs, and output may vary in various embodiments.

TABLE 1

| Label | Description |
|---|---|
| IATW | Traveling waves in phase A, B and C local line currents |
| IBTW | |
| ICTW | |
| VATW | Traveling waves in phase A, B and C local voltages |
| VBTW | |
| VCTW | |
| TWIADD | Disturbance detected in phase A current |
| TWIBDD | Disturbance detected in phase B current |
| TWICDD | Disturbance detected in phase C current |
| TWVADD | Disturbance detected in phase A voltage |
| TWVBDD | Disturbance detected in phase B voltage |
| TWVCDD | Disturbance detected in phase C voltage |
| TWDD | TW disturbance detected at the terminal |

TABLE 2

Setting Parameters

| Label | Description |
|---|---|
| TW32WD | TW32 observation window |
| TW32DO | TW32 dropout time |
| BLKTIME | TD and TW element blocking time |
| TWVTH | TW voltage threshold for detecting voltage TWs |
| TWITH | TW current threshold for detecting current TWs |

TABLE 3

Outputs

| Label | Description |
|---|---|
| TW32F | TW32 element forward |
| TW32FA | Phase segregated TW32 forward elements |

TABLE 3-continued

Outputs

| Label | Description |
|---|---|
| TW32FB | |
| TW32FC | |
| TW32R | TW32 element reverse |
| ENRGYMX | ENRGYMX value when TW32_MHz asserts |
| ENRGYMN | ENRGYMN value when TW32_MHz asserts |
| ENRGYA | ENRGYA value when TW32_MHz asserts |
| ENRGYB | ENRGYB value when TW32_MHz asserts |
| ENRGYC | ENRGYC value when TW32_MHz asserts |

Figure 4:
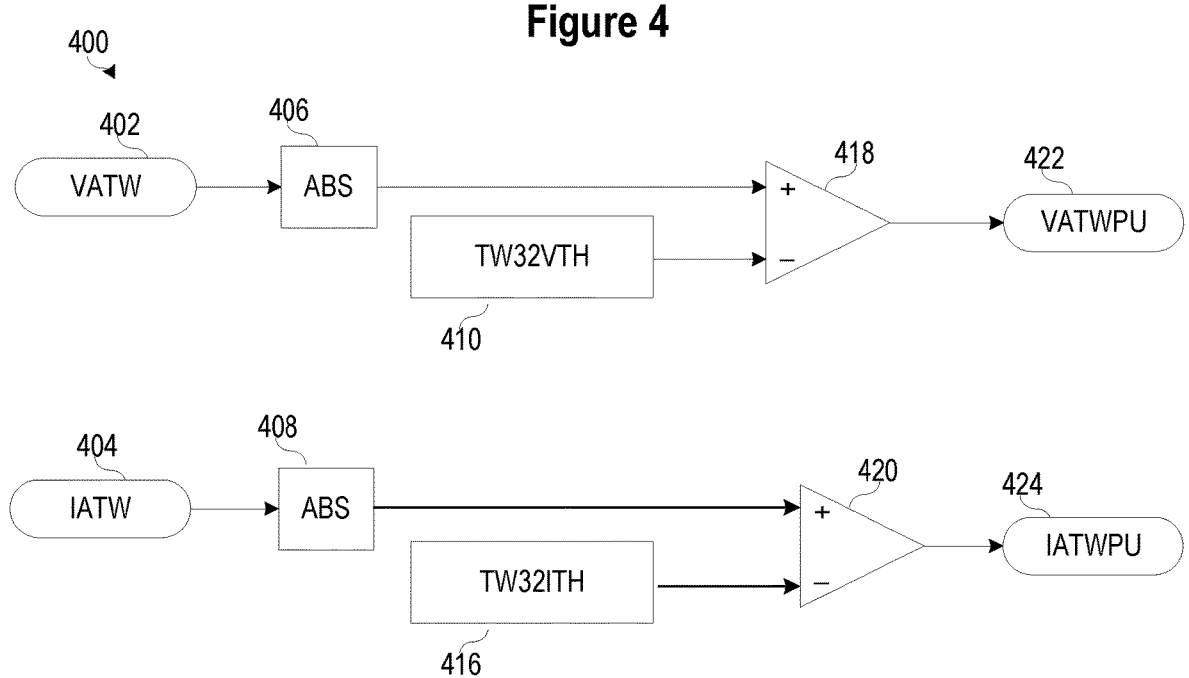
FIG. 4 illustrates a simplified logic diagram of a system for determining voltage and current traveling wave detection outputs from voltage and current traveling wave signals consistent with certain embodiments of the present disclosure.

FIG. 4 illustrates a simplified logic diagram of a system 400 for determining voltage and current traveling wave detection outputs from voltage and current traveling wave signals consistent with certain embodiments of the present disclosure. System 400 may be used to monitor a single phase in a multi-phase system. In the illustrated embodiment, system 400 is associated with an A-phase of a three-phase power system. Systems similar to system 400 may be used for other phases of the electric power delivery system.

Incoming signals voltage signals and current signals, VATW 402 and IATW 404, respectively, may represent electrical parameters of a traveling wave on a portion of an electric power delivery system. An absolute value 406 and 408 of VATW 402 and IATW 404 may be determined. A comparator 418 may determine whether the absolute value of VATW 402 exceeds a voltage threshold, TW32VTH 410. If the absolute value of VATW 402 exceeds TW32VTH 410, the output VATWPU 422 may be asserted.

Figure 5:
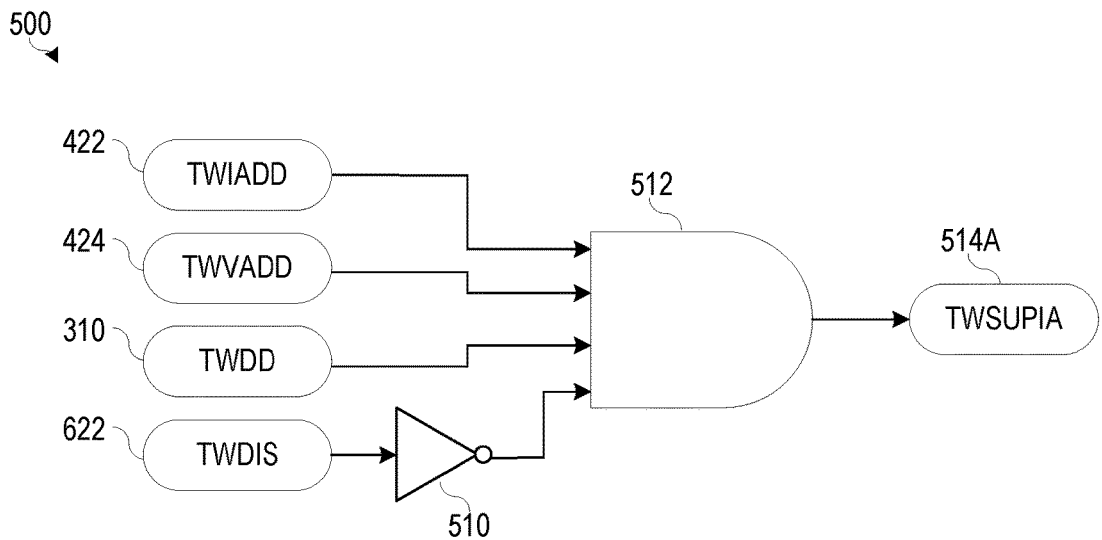
FIG. 5 illustrates a simplified logic diagram for determining a supervision output from a traveling wave detection element consistent with certain embodiments of the present disclosure.

FIG. 5 illustrates a simplified logic diagram for determining a supervision output from a traveling wave detection element 500 consistent with certain embodiments of the present disclosure. System 500 may be used to monitor a single phase in a multi-phase system. In the illustrated embodiment, system 500 is associated with an A-phase of a three-phase power system. Systems similar to system 500 may be used for other phases of the electric power delivery system. Certain embodiments may use the supervision output to ensure the presence of a traveling wave before making a direction determination.

According to the logic diagram of FIG. 5, a traveling wave A-phase supervision output 514A may be asserted when four conditions are met: (1) the A-phase current traveling wave, TWIADD 422, is detected; (2) the A-phase voltage traveling wave, TWVADD 424, is detected; (3) the traveling wave, TWDD 310, is detected by a traveling wave detection system; and (4) the traveling wave disable time signal, TWDIS 622, is not asserted. An inverter 510 may invert the traveling wave disable time, TWDIS 622, signal. In one embodiment, the A-phase traveling wave supervision output, TWSUPIA 514A, is the output of an AND gate 512 that receives the four signals described above.

Figure 6:
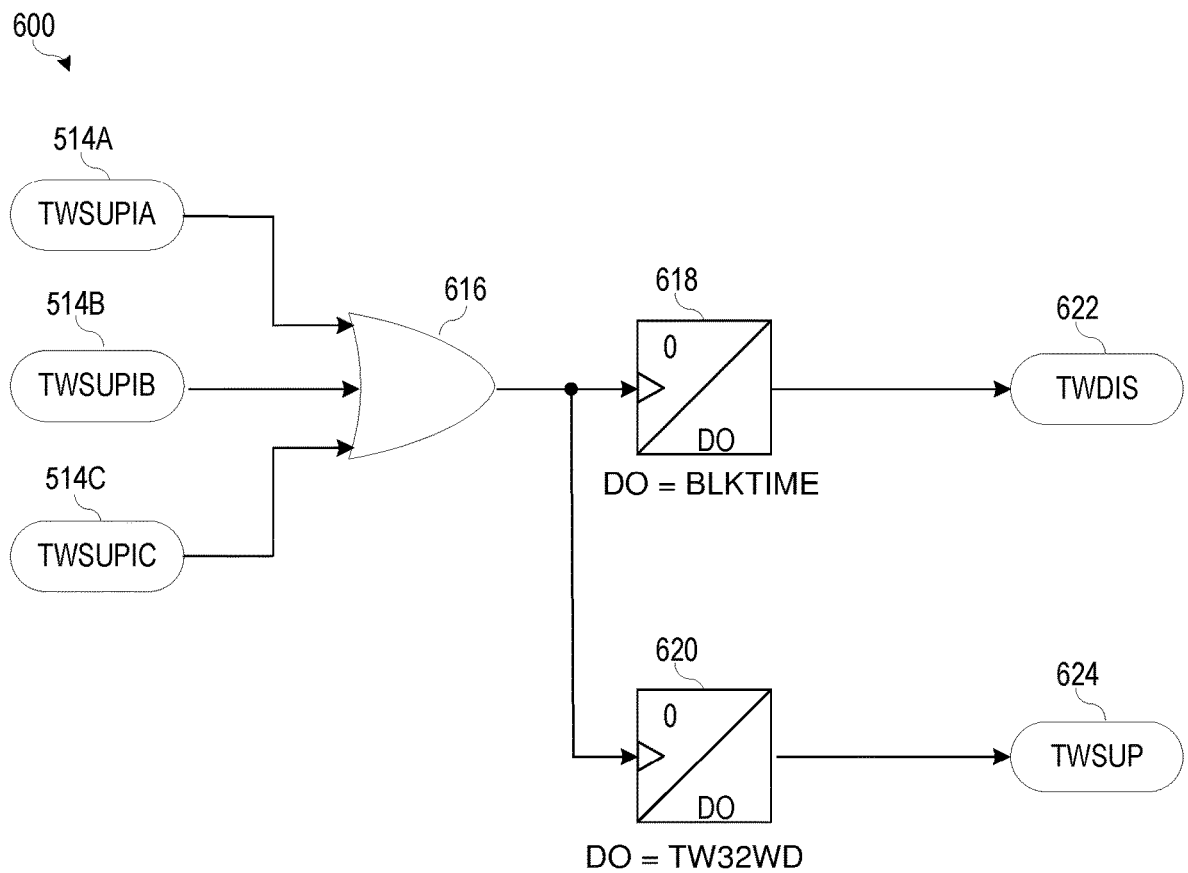
FIG. 6 illustrates a simplified logic diagram for determining disable times and observation windows for determining traveling wave energy consistent with certain embodiments of the present disclosure.

FIG. 6 illustrates a simplified logic diagram of a system 600 for determining disable times and observation windows for determining traveling wave energy consistent with certain embodiments of the present disclosure. Assertion of the supervision outputs of any phase (e.g., TWSUPIA 514A, TWSUPIB 514B, or TWSUPIC 514C) using OR gate 616, activates the TWDIS output. In various embodiments, the TWDIS output may be used to activate a time window in which the power of a traveling wave is determined.

A timer 618 may control the duration of the disable time. In some embodiments, the disable time may be determined by the blocking time parameter, BLKTIME. In one specific embodiment, the TWDIS period 618 may be around 80 ms. When the output TWDIS 622 is asserted, a traveling wave energy calculation may be performed for of all phases. In some embodiments, the assertion of the TWDIS bit may block subsequent assertions of the supervision outputs (TWSUPIA 514A, TWSUPIB 514B, or TWSUPIC 514C), respectively, for the duration of the disable time.

A separate timer 620 may also be activated by the assertion of OR gate 616. Assertion of any of the supervision bits 514A-514C also activates the TWSUP bit for the duration of the timer 620. The output of timer 620, TWSUP 624, may be used to indicate when to determine the maximum and minimum energy values from the three phase energy values and the energy values of the three phases. In various embodiments, the timer 620 may hold the output for a period from around 30 µs to around 50 µs; this period may be determined by the parameter TW32WD.

Figure 7:
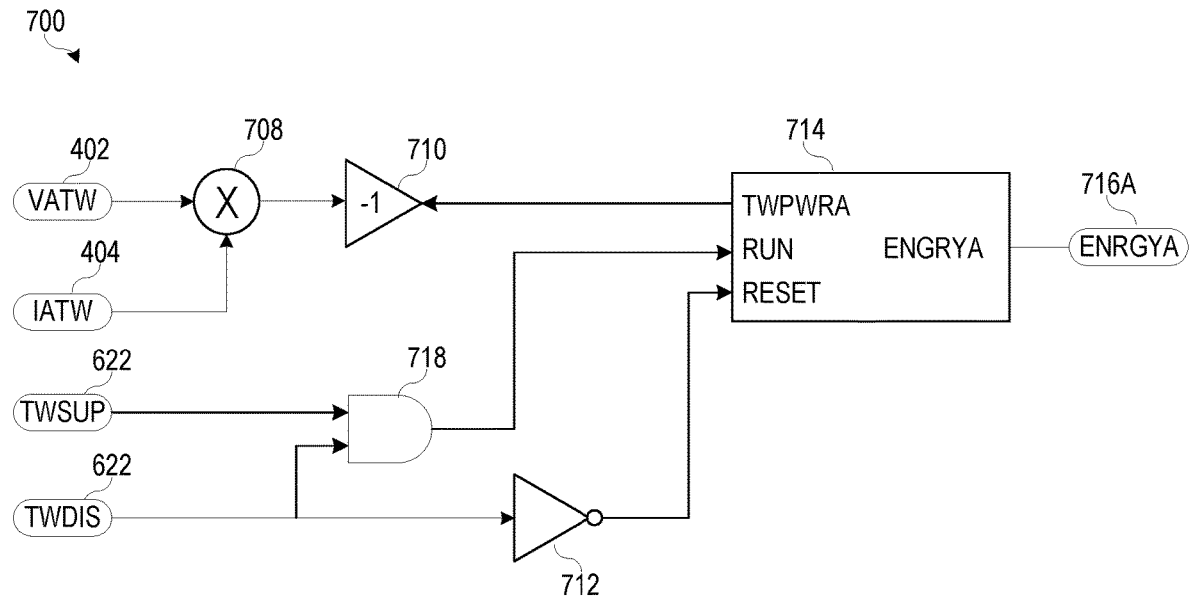
FIG. 7 illustrates a logic diagram of a system for calculating traveling wave energy consistent with certain embodiments of the present disclosure.

FIG. 7 illustrates a logic diagram of a system 700 for calculating traveling wave energy consistent with certain embodiments of the present disclosure. System 700 may be used to monitor a single phase in a multi-phase system. In the illustrated embodiment, system 700 is associated with an A-phase of a three-phase power system. Systems similar to system 700 may be used for other phases of the electric power delivery system.

A multiplier 708 may determine the product of the A-phase voltage traveling wave 402 and the A-phase current traveling wave 404. In some embodiments, the product of the A-phase voltage traveling wave 402 and the A-phase current traveling wave 404 may be referred to as a torque value. The product of VATW 402 and IATW 404 represents the power of the traveling wave. The output of multiplier 708 may be multiplied by negative one by amplifier 710. Accumulator 714 may accumulate the output of amplifier 710, the power of the traveling wave on the A-phase, TWPRWA, while the TWDIS 622 signal is asserted. An AND gate 718 may use the inputs TWSUP 622 and TWDIS 622 to selectively enable accumulator 714 using a RUN input. When the TWDIS 622 signal is unasserted, inverter 712 may assert a RESET signal of accumulator 714. In other words, accumulator 714 may run when TWSUP 622 and TWDIS 622 are asserted, and may determine an energy of the traveling wave on the A-Phase during that period of time.

Figure 8:
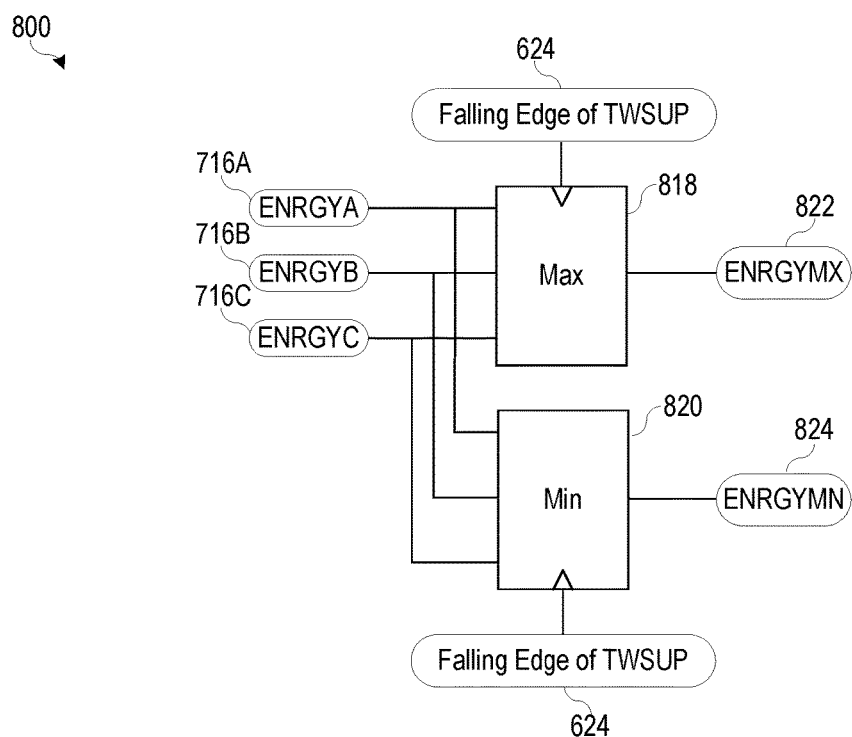
FIG. 8 illustrates a logic diagram of a system for calculating minimum and maximum energy consistent with certain embodiments of the present disclosure.

FIG. 8 illustrates logic of a system 800 for determining a maximum energy, ENRGYMX 822, and minimum energy, ENRGYMN 824, upon expiration of the traveling wave directional observation window, which is indicated by the falling edge of TWSUP 624. The parameter TW32WD determines the duration of the traveling wave observation window. The maximum and minimum of the accumulated energy calculations for all three phases ENRGYA 716A, ENRGYB 716B, and ENRGYC 716C are determined with the maximum block 818 and minimum block 820.

Figure 9A:
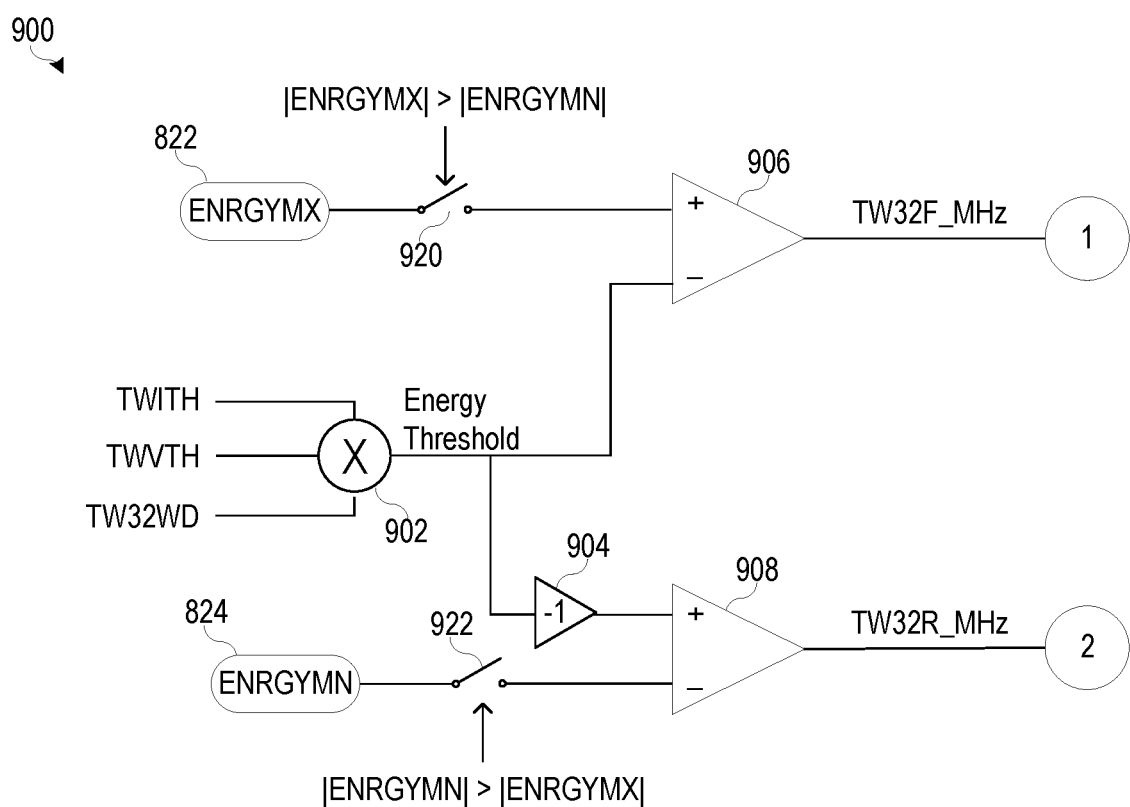
FIG. 9A illustrates a logic diagram of a system for determining a forward traveling wave signal and a reverse traveling wave signal consistent with certain embodiments of the present disclosure.

FIG. 9A illustrates a logic diagram of a portion of a system 900 for determining a forward traveling wave signal and a reverse traveling wave signal consistent with certain embodiments of the present disclosure. The system illustrated in FIG. 9A may operate in conjunction with the system illustrated in FIG. 9B to assert a forward traveling wave signal, TW32F 910, when a fault is in the forward direction, and to assert a reverse traveling wave signal, TW32R 912, when a fault is in the reverse direction using the directional traveling wave principles discussed herein.

In FIG. 9A, when the absolute value of the maximum energy 822 is greater than the absolute value of the minimum energy 824, switch 920 is closed, such that the maximum energy 822 is used in comparator 906. When the absolute value of the minimum energy 824 is greater than the absolute value of the maximum energy 822, then switch 922 is closed, such that the minimum energy 824 is used in comparator 908. An energy threshold used by comparators 906 and 908 may be determined based by multiplier 902 based on the value of certain settings associated with the traveling wave directional element. In the illustrated embodiment, the settings TWITH, TWVTH, and TW32WD are used to determine the energy threshold. In other embodiments, the energy threshold may be determined using other settings.

When switch 920 is closed and the maximum energy is greater than the energy threshold, the output of comparator 906 is asserted. When switch 922 is closed, the negative value 904 of the energy threshold is compared with the minimum energy 824 by comparator 908. If the minimum energy is less than the negative of the energy threshold, the output of comparator 908 is asserted. The outputs of comparators 906 and 908 may be passed to the portion of system 900 illustrated in FIG. 9B, as TW32F_MHz and TW32R_MHz, respectively. The TW32F_MHz output may indicate a forward traveling wave condition, while the TW32R_MHz output may indicate a reverse traveling wave condition. In one embodiment, when the absolute value of the minimum energy is equal to the absolute value of the maximum energy, the forward fault signal and the reverse fault signal may remain unasserted.

Figure 9B:
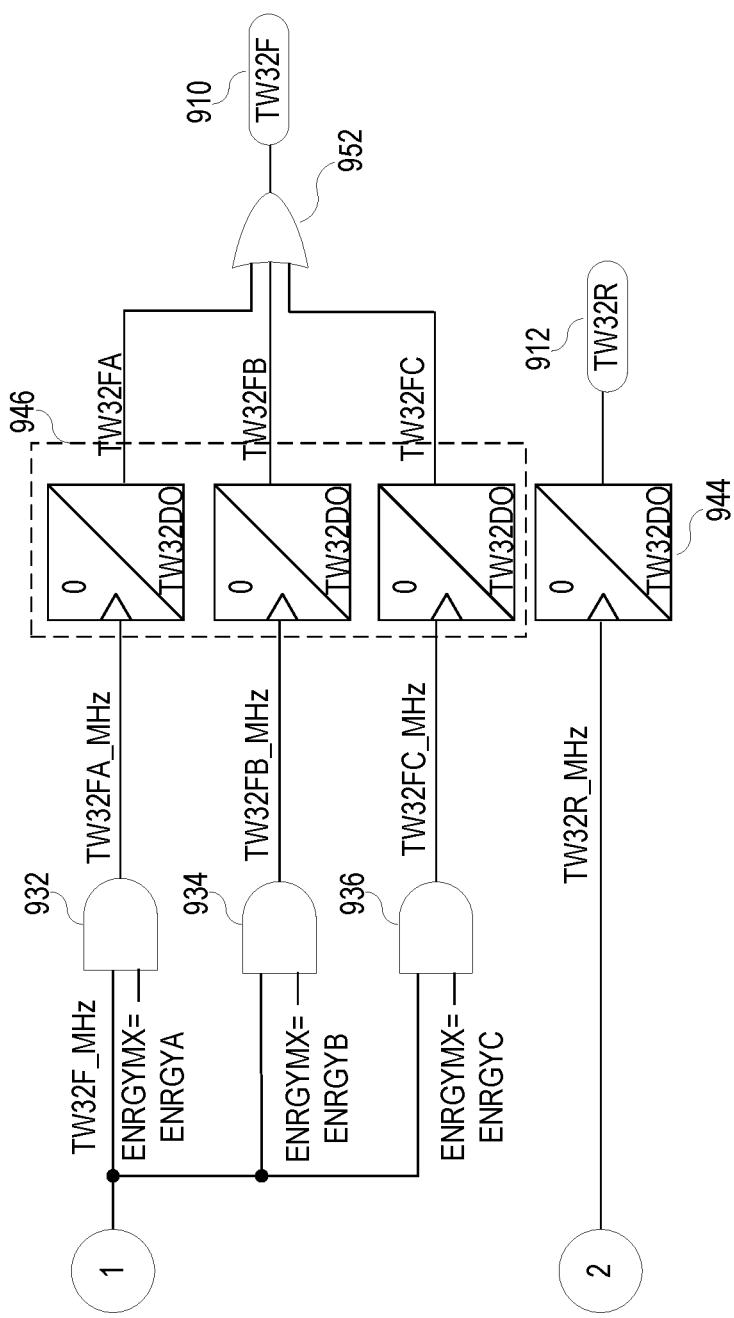
FIG. 9B illustrates a logic diagram of a portion of a system for determining a forward traveling wave signal and a reverse traveling wave signal consistent with embodiments of the present disclosure.

FIG. 9B illustrates a logic diagram of a portion of a system 900 for determining a forward traveling wave signal and a reverse traveling wave signal consistent with embodiments of the present disclosure. The assertion of TW32F_MHz may be an input to a plurality of AND gates 932, 934, and 936. The AND gates 932, 934, and 936 may also receive an indication of which phase corresponds to the ENRGYMX value, and the appropriate signal (i.e., TW32FA_MHz, TW32FB_MHz, or TW32FC_MHz) may be asserted. The TW32R_MHz signal may also be provided to a timer 944 that may hold the output of the timer 944 for a period of time, TW32DO. Similarly, the outputs of AND gates 932, 934 and 936 may be provided to a plurality of timers 946. The output of the timer 944 may assert the TW32R signal. Similarly, the assertion of the outputs of timers 946 may cause OR gate 952 to assert, which in turn may correspond to the TW32F signal. The operation of timers 944-946 may be used transition high-frequency detection signals (i.e., TW32F_MHz, TW32FA_MHz, TW32FB_MHz, TW32FC_MHz, and TW32R_MHz), from a high frequency to lower-frequency fault detection signals (i.e., TW32, TW32FA, TW32FB, TW32FC, TW32R). In some embodiments, the high-frequency signals may have frequencies on the order of 1 MHz and the lower-frequency signals may have frequencies on the order of 10 kHz. In other embodiments, other frequencies may be used.

Figure 10:
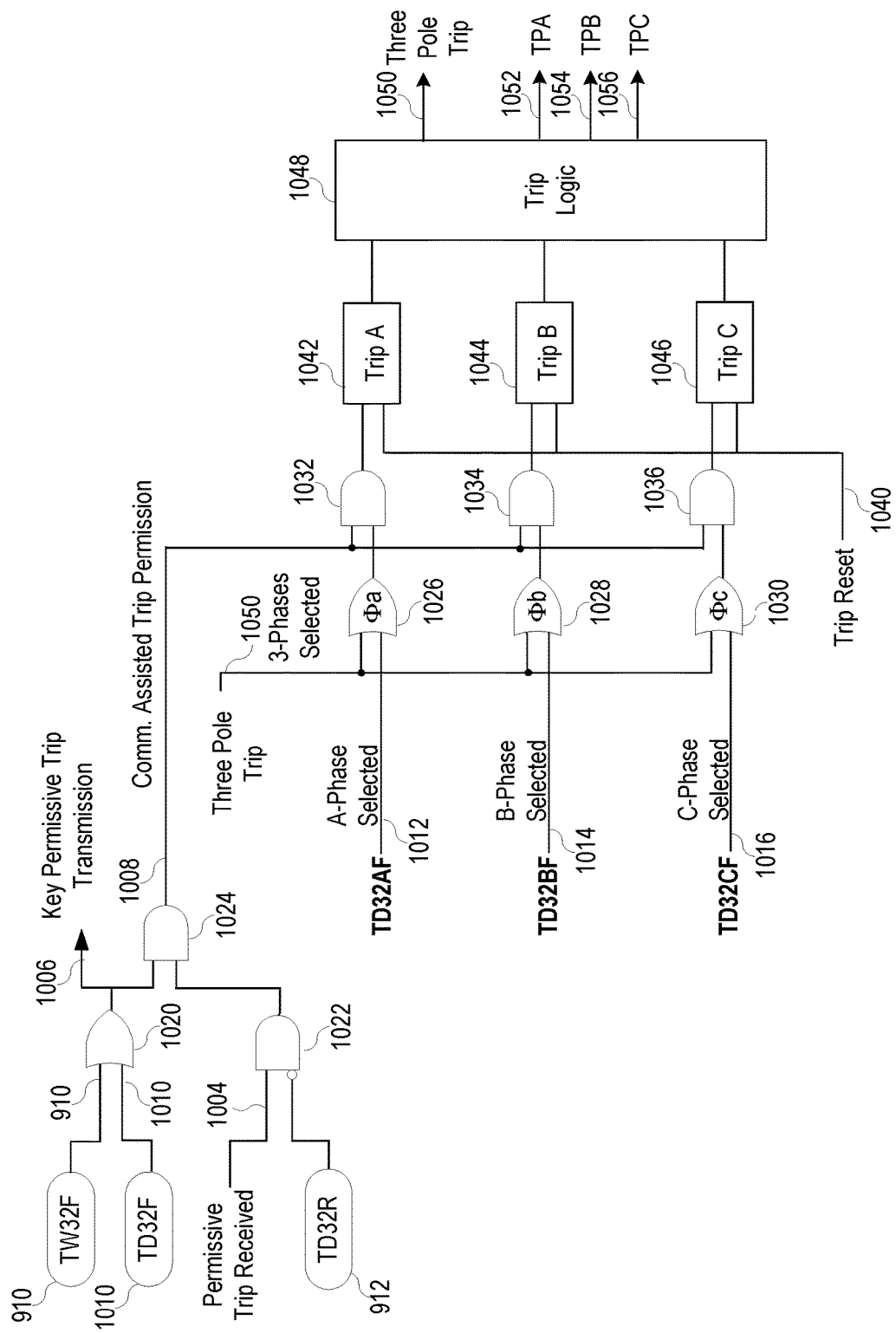
FIG. 10 illustrates a logic diagram for a directional comparison permissive overreaching transfer trip scheme consistent with certain embodiments of the present disclosure.

FIG. 10 illustrates a block diagram of logic for a directional comparison Permissive Overreaching Transfer Trip (POTT) scheme using the traveling wave forward directional signal TW32F 910 and a time-domain (or incremental quantity) forward directional signal TD32F 1010 to protect a power system by sending a trip command to one or more phases. Assertion of either TW32F 910 or TD32F 1010 signals causes OR gate 1020 to assert output 1006 to activate a key permissive trip transmission. A communication assisted trip permission signal 1008 is asserted by AND gate 1024 when both the key permissive trip 1006 is asserted and a permissive trip 1004 is received and the TD32R signal 912 is not set (AND gate 1022).

Incremental quantity forward directional signals for each phase TD32AF 1012, TD32BF 1014, and TD32CF 1016 are each separately used in OR gates 1026, 1028, and 1030, respectively. A three-pole trip signal 1050 is also supplied to OR gates 1026, 1028, and 1030. If either the three-pole trip signal 1050 or the A-phase incremental quantity forward fault signal 1012 is set, OR gate 1026 is set enabling AND gate 1032 along with the communication assisted trip permission 1008. Similarly, if either the three-pole trip signal 1050 or the B-phase incremental quantity forward fault signal 1014 is set, OR gate 1028 is set enabling AND gate 1034 along with the communication assisted trip permission 1008. Finally, if either the three-pole trip signal 1050 or the C-phase incremental quantity forward fault signal 1016 is set, OR gate 1030 is set enabling AND gate 1036 along with the communication assisted trip permission 1008.

When both the communication assisted trip permission signal 1008 and either the three-pole trip 1050 or TD32AF 1012 signals are present in AND gate 1032, a Trip A 1042 signal is activated. Similarly, when both the communication assisted trip permission signal 1008 and either the three-pole trip 1050 or TD32BF 1014 signals are present in AND block 1034, a Trip B 1044 signal is activated. Finally, when both the communication assisted trip permission signal 1008 and either the three-pole trip 1050 or TD32CF 1016 signals are present in AND block 1036, a Trip C 1046 signal is activated. Trip signals 1042, 1044, 1046 may be reset by 1040. Trip logic 1048 receives the trip signals, and produces an appropriate trip signal on the appropriate phase using one or more of an A-phase trip signal 1052, a B-phase trip signal 1054, a C-phase trip signal 1056, and three-pole trip 1050.

Figure 11:
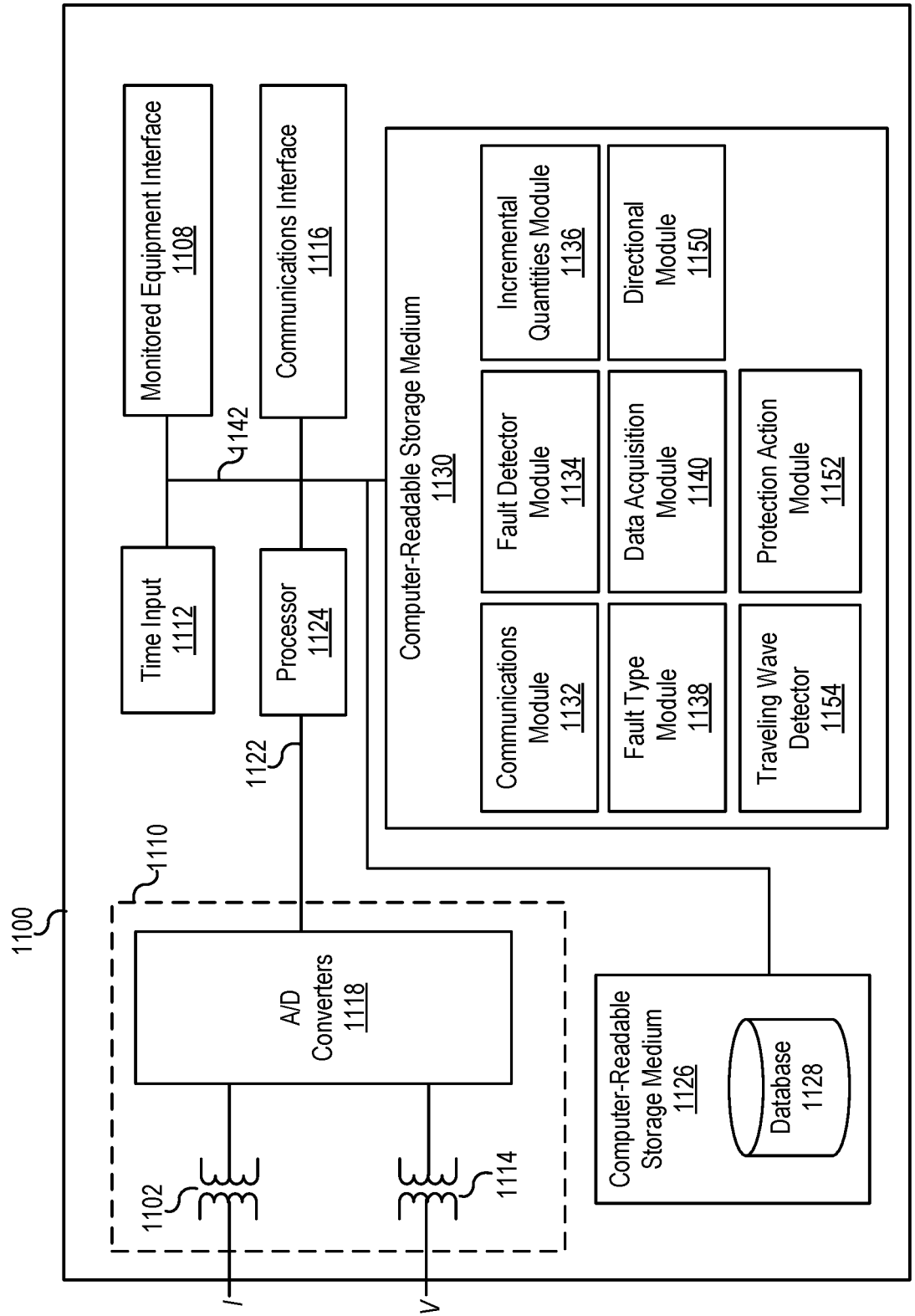
FIG. 11 illustrates a functional block diagram of a system for detecting faults and estimating a fault location using traveling waves consistent with certain embodiments of the present disclosure.

FIG. 11 illustrates a functional block diagram of a system 1100 for detecting and locating faults using time-domain quantities consistent with embodiments of the present disclosure. In certain embodiments, the system 1100 may comprise an IED system configured to, among other things, obtain and calculate time-domain quantities, detect and locate faults using a time-domain distance module, detect and locate faults using a time-domain directional module, and detect and locate faults using traveling waves. System 1100 may be implemented using hardware, software, firmware, and/or any combination thereof. In some embodiments, system 1100 may be embodied as an IED, while in other embodiments, certain components or functions described herein may be associated with other devices or performed by other devices. The specifically illustrated configuration is merely representative of one embodiment consistent with the present disclosure.

System 1100 includes a communications interface 1116 configured to communicate with devices and/or IEDs. In certain embodiments, the communications interface 1116 may facilitate direct communication with other IEDs or communicate with systems over a communications network. Communications interface 1116 may facilitate communications through a network. System 1100 may further include a time input 1112, which may be used to receive a time signal (e.g., a common time reference) allowing system 1100 to apply a time-stamp to the acquired samples. In certain embodiments, a common time reference may be received via communications interface 1116, and accordingly, a separate time input may not be required for time-stamping and/or synchronization operations. One such embodiment may employ the IEEE 1588 protocol. A monitored equipment interface 1108 may be configured to receive status information from, and issue control instructions to, a piece of monitored equipment (such as a circuit breaker, conductor, transformer, or the like).

Processor 1124 may be configured to process communications received via communications interface 1116, time input 1112, and/or monitored equipment interface 1108. Processor 1124 may operate using any number of processing rates and architectures. Processor 1124 may be configured to perform various algorithms and calculations described herein. Processor 1124 may be embodied as a general purpose integrated circuit, an application specific integrated circuit, a field-programmable gate array, and/or any other suitable programmable logic device.

In certain embodiments, system 1100 may include a sensor component 1110. In the illustrated embodiment, sensor component 1110 is configured to gather data directly from conventional electric power system equipment such as a conductor (not shown) using conventional PTs and/or CTs. The sensor component 1110 may use, for example, transformers 1102 and 1114 and A/D converters 1118 that may sample and/or digitize filtered waveforms to form corresponding digitized current and voltage signals provided to data bus 1122. Current (I) and voltage (V) inputs may be secondary inputs from conventional instrument transformers such as, CTs and VTs. A/D converters 1118 may include a single A/D converter or separate A/D converters for each incoming signal. A current signal may include separate current signals from each phase of a three-phase electric power system. A/D converters 1118 may be connected to processor 1124 by way of data bus 1122, through which digitized representations of current and voltage signals may be transmitted to processor 1124. In various embodiments, the digitized current and voltage signals may be used to calculate time-domain quantities for the detection and the location of a fault on an electric power system as described herein.

A computer-readable storage medium 1126 may be the repository of a database 1128 containing electric power line properties for each transmission line and/or each section of each transmission line, such as impedances, resistances, propagation times, reactances, lengths, and/or the like. Another computer-readable storage medium 1130 may be the repository of various software modules configured to perform any of the methods described herein. A data bus 1142 may link monitored equipment interface 1108, time input 1112, communications interface 1116, and computer-readable storage mediums 1126 and 1130 to processor 1124.

Computer-readable storage mediums 1126 and 1130 may be separate mediums, as illustrated in FIG. 11, or may be the same medium (i.e. the same disk, the same non-volatile memory device, or the like). Further, the database 1128 may be stored in a computer-readable storage medium that is not part of the system 1100, but that is accessible to system 1100 using, for example, communications interface 1116.

Communications module 1132 may be configured to allow system 1100 to communicate with any of a variety of external devices via communications interface 1116. Communications module 1132 may be configured for communication using a variety of data communication protocols (e.g., UDP over Ethernet, IEC 61850, etc.).

Data acquisition module 1140 may collect data samples such as the current and voltage quantities and the incremental quantities. The data samples may be associated with a timestamp and made available for retrieval and/or transmission to a remote IED via communications interface 1116. Traveling waves may be measured and recorded in real-time, since they are transient signals that vanish rapidly in an electric power delivery system. Data acquisition module 1140 may operate in conjunction with fault detector module 1134. Data acquisition module 1140 may control recording of data used by the fault detector module 1134. According to one embodiment, data acquisition module 1140 may selectively store and retrieve data and may make the data available for further processing. Such processing may include processing by fault detector module 1134, which may be configured to determine the occurrence of a fault with an electric power distribution system.

An incremental quantities module 1136 may be configured to calculate time-domain incremental quantities based on the techniques disclosed herein. The incremental quantities module 1136 may be configured to use digitized representations of current and/or voltage measurements to calculate incremental quantities therefrom. In some embodiments, system 1100 may be one of a pair of IEDs in communication with different terminals on an electric power system such as the IEDs and system of FIG. 1. In one embodiment, each IED of a pair of IEDs calculates incremental quantities in its own incremental quantities module 1136 for later processing and sharing between the IEDs. In another embodiment, system 1100 may receive digitized representations from both the sensor component 1110 and from a remote IED over a communications channel, and the incremental quantities module 1136 may be configured to calculate incremental signals from both sources to calculate both local and remote incremental quantities.

A fault type module 1138 may be configured to determine a fault type using incremental quantities from module 1136.

A directional module 1150 may be configured to determine a fault direction (forward or reverse). The directional module 1150 may be configured to use incremental quantities from incremental quantities module 1136 to determine a fault direction. Directional module 1150 may be configured to determine the direction based on traveling wave signals. The directional module 1150 may use the principles described herein to determine a fault direction using traveling wave signals and incremental quantities. In various embodiments, directional module 1150 may be configured to implement the logic described in connection with FIG. 4 through FIG. 9.

A protective action module 1152 may be configured to implement a protective action based on the declaration of a fault by the fault detector module 1134 and the directional module 1136. In various embodiments, a protective action may include tripping a breaker, selectively isolating a portion of the electric power system, etc. In various embodiments, the protective action module 1152 may coordinate protective actions with other devices in communication with system 1100. The protective action module 1152 may be configured to operate the POTT scheme as illustrated and described in conjunction with FIG. 10. In various embodiments system 1100 may be configured to provide protection based on instantaneous voltages and currents. Such signal components require shorter data windows but facilitate faster protection. Various embodiments of system 1100 may be configured to achieve an operating time of approximately 1 millisecond. Such a system may utilize a lumped parameter circuit-based and TW-based time-domain approach and may allow for versatile applications covering various relay input voltage sources and available communications channels. Such a system may utilize high sampling rates (≥1 MHz), high-resolution (16 bits) synchronized sampling, high-fidelity time synchronization, and a communications network capable of exchanging all acquired data (≥100 Mbps), or high numeric burden required by some of the algorithms (≥1 G multiplications per second).

A traveling wave detector 1154 may be configured to identify the presence of a traveling wave in voltage and or current measurements of an electrical power system. The system may be configured to receive such measurements from sensor component 1110 and/or communications interface 1116. In some embodiments, the traveling wave detector 1154 may implement functionality associated with traveling wave detector 306 in FIG. 3.

Although several embodiments discussed hereinabove refer to three phases of an alternating-current electric power delivery system, the principles herein may be applied to a multiple-phase alternating-current electric power system having more or less than three phases. For example, a four-phase electric power delivery system is contemplated, as is a six-phase electric power delivery system. The principles taught herein may be applied. In other embodiments, the principles taught may be applied to a direct-current electric power delivery system.

While specific embodiments and applications of the disclosure have been illustrated and described, it is to be understood that the disclosure is not limited to the precise configuration and components disclosed herein. Various modifications, changes, and variations apparent to those of skill in the art may be made in the arrangement, operation, and details of the methods and systems of the disclosure without departing from the spirit and scope of the disclosure.

What is claimed is:

1. A system configured to detect a fault in an electric power delivery system, comprising:
    a data acquisition subsystem configured to receive a plurality of representations of electrical conditions associated with at least a portion of the electric power delivery system;
    a traveling wave detector configured to detect a traveling wave event based on the plurality of representations of electrical conditions;
    a traveling wave directional subsystem configured to:
        calculate an energy value of the traveling wave event during an accumulation period based on the detection of the traveling wave by the traveling wave detector;
        determine a maximum energy value and a minimum energy value of the energy value during the accumulation period; and
        determine a fault direction based on the maximum energy value and the minimum energy value;
    a fault detector subsystem configured to declare the fault based on the determined fault direction; and
    a protective action subsystem configured to implement a protective action based on the declaration of the fault.

2. The system of claim 1, wherein each of the data acquisition subsystem, traveling wave detector, and traveling wave directional subsystem are configured to monitor a plurality of phases of the electric power delivery subsystem.

3. The system of claim 2, wherein the fault detector subsystem is further configured to determine a faulted phase based on the fault direction for each phase.

4. The system of claim 2, wherein the traveling wave directional subsystem is further configured to receive an indication of which phase among the plurality of phases corresponds to the maximum energy value and assert a signal corresponding with that phase.

5. The system of claim 4, wherein the protective action subsystem is further configured to activate a trip signal depending on the declaration of the fault.

6. The system of claim 1, wherein the traveling wave directional subsystem is further configured to determine the fault direction as forward or reverse based on a comparison of one of the maximum energy value and the minimum energy value to an energy threshold.

7. The system of claim 6, wherein the energy threshold value comprises a function of traveling wave directional element settings.

8. The system of claim 1, wherein the protective action subsystem further comprises a directional comparison permissive overreaching transfer trip scheme activated by the determined fault direction.

9. The system of claim 1, wherein the data acquisition system comprises one of a sensor component configured to determine electrical conditions on an electrical transmission line and a communication interface configured to receive the plurality of representations of electrical conditions.

10. The system of claim 1, wherein the accumulation period is determined by a timer initiated when a plurality of traveling wave voltage measurements comprised in the plurality of representations of electrical conditions exceed a first threshold and a plurality of traveling wave current measurements comprised in the plurality of representations of electrical conditions exceed a second threshold.

11. The system of claim 1, wherein the accumulation period comprises a duration between 30 µs and 50 µs.

12. The system of claim 1, wherein the data acquisition subsystem further comprises a differentiator-smoother configured to determine traveling wave phase currents and voltages.

13. A method for detecting a fault in an electric power delivery system, comprising:
    receiving a plurality of representations of electrical conditions associated with at least a portion of the electric power delivery system;
    detecting a traveling wave event based on the plurality of representations of electrical conditions;
    calculating an energy value of the traveling wave event during an accumulation period based on the detection of the traveling wave;
    determining a maximum energy value and a minimum energy value of the energy value during the accumulation period;
    determining a fault direction based on the maximum energy value and the minimum energy value;
    declaring the fault based on the determined fault direction; and
    implementing a protective action based on the declaration of the fault.

14. The method of claim 13, further comprising monitoring each of a plurality of phases of the electric power delivery subsystem to detect the fault.

15. The method of claim 14, further comprising determining a faulted phase based on the fault direction for each phase.

16. The method of claim 13, further comprising calculating the energy value as a sign-inverted product of a plurality of traveling wave voltage and a plurality of traveling wave currents.

17. The method of claim 13, further comprising determining the fault direction by comparing each of the maximum energy value and the minimum energy value to an energy threshold.

18. The method of claim 17, wherein the energy threshold value comprises a function of traveling wave directional element settings.

19. The method of claim 13, wherein the protective action subsystem further comprises a directional comparison permissive overreaching transfer trip scheme activated by the determined fault direction.

20. The method of claim 13, further comprising determining the accumulation period using a timer initiated when a plurality of traveling wave voltage measurements comprised in the plurality of representations of electrical conditions exceed a first threshold and a plurality of traveling wave current measurements comprised in the plurality of representations of electrical conditions exceed a second threshold.

21. The method of claim 13, further comprising processing the plurality of representations of electrical conditions using a differentiator-smoother.

\* \* \* \* \*